United States Patent
Hirose

(10) Patent No.: US 9,209,209 B2
(45) Date of Patent: Dec. 8, 2015

(54) PHOTOELECTRIC CONVERSION DEVICE AND METHOD FOR OPERATING THE SAME

(75) Inventor: Atsushi Hirose, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 821 days.

(21) Appl. No.: 13/277,244

(22) Filed: Oct. 20, 2011

(65) Prior Publication Data

US 2012/0104238 A1    May 3, 2012

(30) Foreign Application Priority Data

Oct. 29, 2010   (JP) .................. 2010-242912

(51) Int. Cl.
| | |
|---|---|
| H01J 40/14 | (2006.01) |
| H01L 31/112 | (2006.01) |
| H01L 27/144 | (2006.01) |
| G01J 1/46 | (2006.01) |
| H04N 5/374 | (2011.01) |

(52) U.S. Cl.
CPC .............. *H01L 27/1443* (2013.01); *G01J 1/46* (2013.01); *H04N 5/374* (2013.01)

(58) Field of Classification Search
CPC ....... H04N 5/369; H04N 5/374; H04N 5/376; H04N 5/3765; H01L 27/1443; H01L 27/14601; H01L 27/146; G01J 1/46
USPC ..... 250/208.1, 214 A, 214.1, 214 R, 214 SW; 257/291, 292; 345/102, 207; 348/308, 348/302, 294
See application file for complete search history.

(56) References Cited

U.S. PATENT DOCUMENTS

| | | | |
|---|---|---|---|
| 5,898,332 A * | 4/1999 | Lefevre .................. | 327/336 |
| 5,929,434 A * | 7/1999 | Kozlowski et al. ....... | 250/214 A |
| 6,236,063 B1 | 5/2001 | Yamazaki et al. | |
| 6,707,410 B1 * | 3/2004 | Bock ..................... | 341/155 |
| 6,734,413 B2 * | 5/2004 | Dai ........................ | 250/208.1 |
| 6,747,638 B2 | 6/2004 | Yamazaki et al. | |
| 6,995,753 B2 | 2/2006 | Yamazaki et al. | |
| 7,224,391 B2 | 5/2007 | Kimura | |
| 7,495,272 B2 | 2/2009 | Maruyama et al. | |
| 7,737,478 B2 | 6/2010 | Yanagisawa et al. | |
| 7,932,126 B2 | 4/2011 | Maruyama et al. | |
| 8,124,922 B2 * | 2/2012 | Koyama et al. .......... | 250/214 R |
| 8,232,512 B2 * | 7/2012 | Marzuki et al. ........... | 250/205 |
| 8,279,312 B2 * | 10/2012 | Lule .......................... | 348/308 |

(Continued)

FOREIGN PATENT DOCUMENTS

| | | |
|---|---|---|
| JP | 2002-165133 A | 6/2002 |
| JP | 2004-179902 A | 6/2004 |

(Continued)

*Primary Examiner* — John Lee
(74) *Attorney, Agent, or Firm* — Nixon Peabody LLP; Jeffrey L. Costellia

(57) ABSTRACT

To provide a photoelectric conversion device with low power consumption and a method for operating the photoelectric conversion device. The photoelectric conversion device includes a charge storage capacitor portion, a photodiode, and a plurality of transistors. The charge storage capacitor portion is charged after being reset. Then, the charge storage capacitor portion is discharged through the photodiode or a current mirror circuit connected to the photodiode for a given period of time, and after that, the potential of the charge storage capacitor portion is read. Since power is consumed only at the time of charging, power consumption can be reduced.

12 Claims, 12 Drawing Sheets

(56) References Cited

U.S. PATENT DOCUMENTS

| | | | |
|---|---|---|---|
| 8,334,495 B2* | 12/2012 | Koyama et al. | 250/214 R |
| 8,692,176 B2* | 4/2014 | Kelly et al. | 250/208.1 |
| 2003/0085337 A1* | 5/2003 | Dai | 250/208.1 |
| 2003/0136915 A1* | 7/2003 | Wany | 250/370.14 |
| 2004/0036643 A1* | 2/2004 | Bock | 341/155 |
| 2004/0182990 A1* | 9/2004 | Dai | 250/208.1 |
| 2006/0157643 A1* | 7/2006 | Bamji et al. | 250/208.1 |
| 2007/0153109 A1* | 7/2007 | Lule | 348/308 |
| 2007/0235632 A1* | 10/2007 | Bin Marzuki et al. | 250/214 A |
| 2008/0158137 A1 | 7/2008 | Yoshida | |
| 2009/0001256 A1 | 1/2009 | Yanagisawa et al. | |
| 2009/0027372 A1 | 1/2009 | Shishido et al. | |
| 2009/0324244 A1* | 12/2009 | Koyama et al. | 398/154 |
| 2010/0072350 A1* | 3/2010 | De Wit et al. | 250/208.1 |
| 2010/0134735 A1 | 6/2010 | Nakamura et al. | |
| 2010/0231562 A1* | 9/2010 | Brown | 345/207 |
| 2010/0237229 A1 | 9/2010 | Yanagisawa et al. | |
| 2011/0148835 A1 | 6/2011 | Yamazaki | |
| 2012/0104238 A1* | 5/2012 | Hirose | 250/214 R |
| 2012/0280112 A1* | 11/2012 | Collins | 250/208.1 |
| 2012/0312967 A1* | 12/2012 | De Wit et al. | 250/214 A |

FOREIGN PATENT DOCUMENTS

| | | |
|---|---|---|
| JP | 2005-136392 | 5/2005 |
| JP | 2010-153834 A | 7/2010 |

* cited by examiner

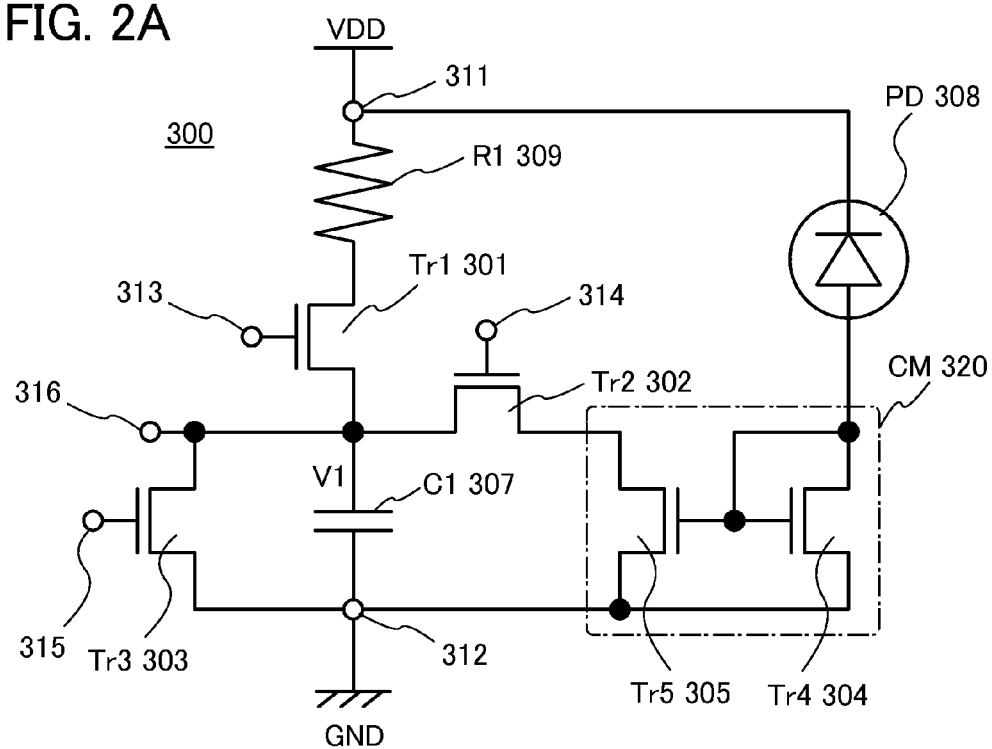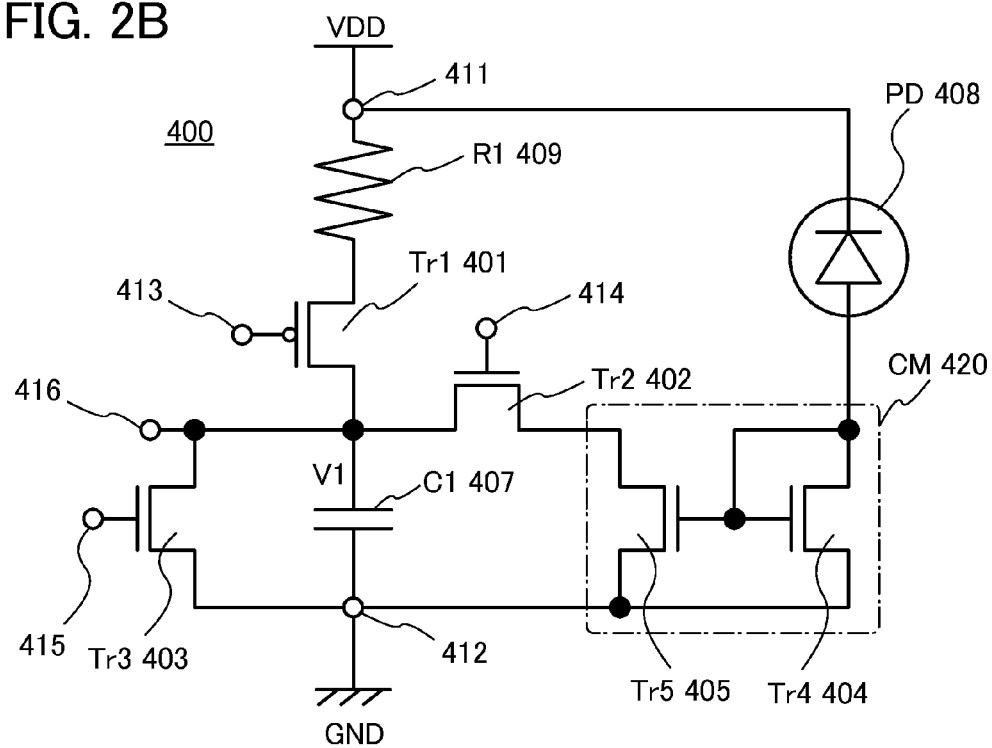

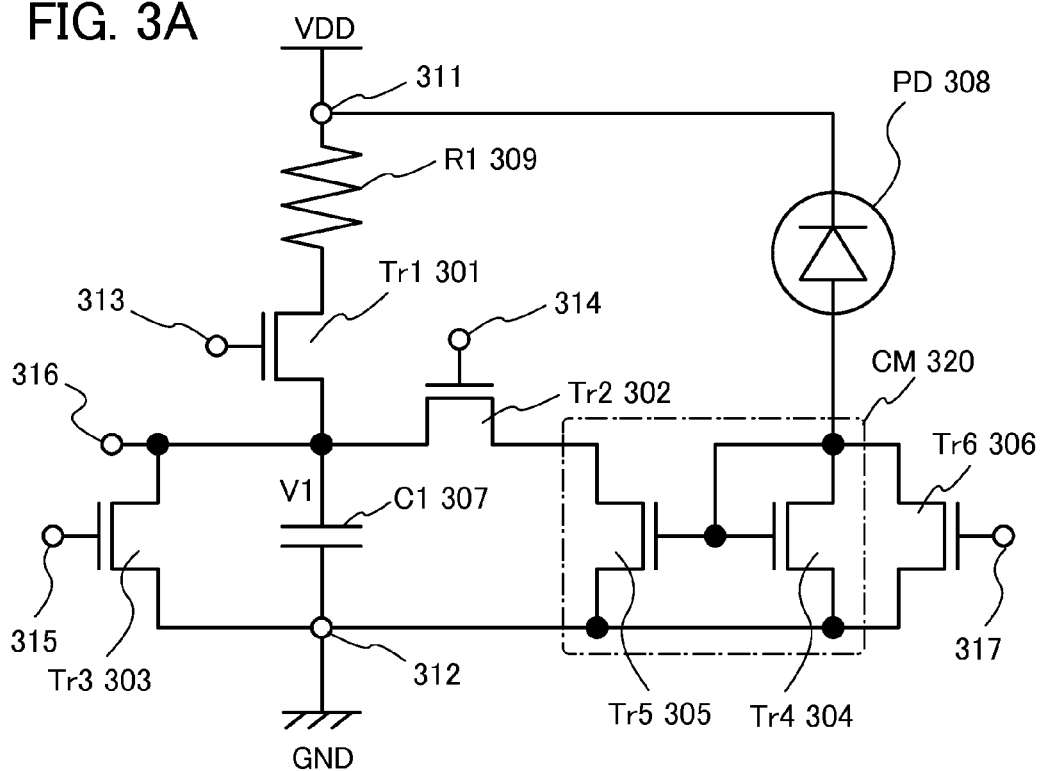
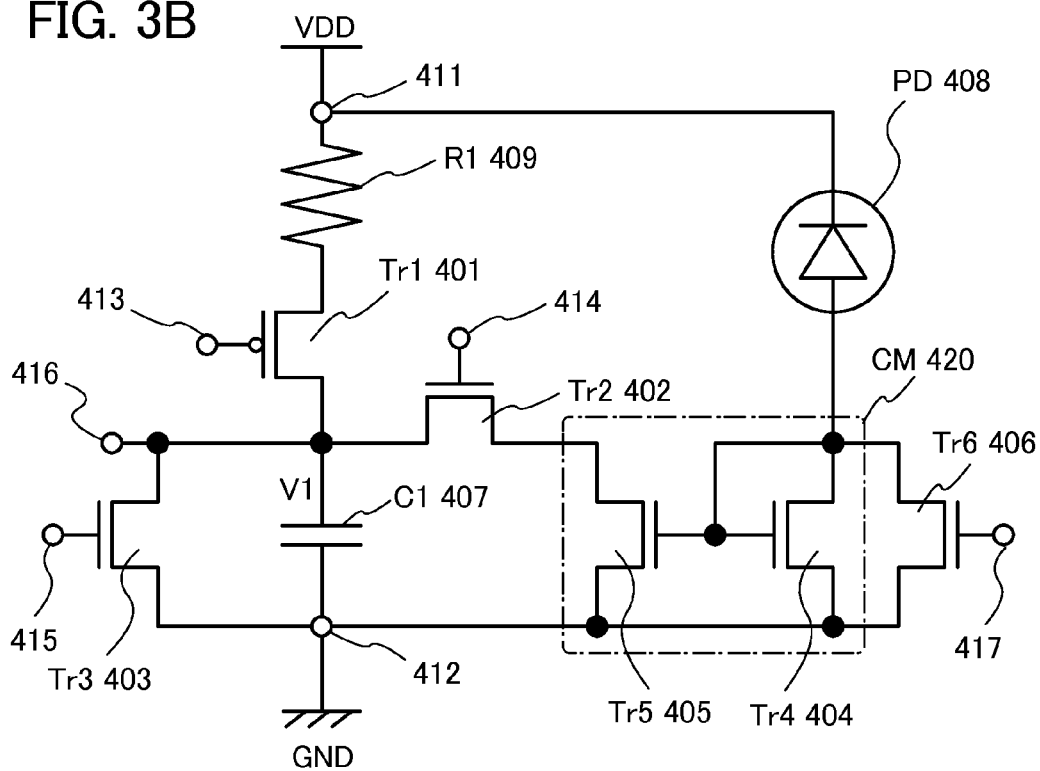

● In
○ Sn
○ Zn
● O

- In
- Ga
- Zn
- O

PHOTOELECTRIC CONVERSION DEVICE AND METHOD FOR OPERATING THE SAME

BACKGROUND OF THE INVENTION

1. Field of the Invention

The present invention relates to a photoelectric conversion device having a circuit including a transistor.

2. Description of the Related Art

A number of photoelectric conversion devices used for detecting electromagnetic waves are generally known. For example, photoelectric conversion devices having sensitivity ranging from ultraviolet rays to infrared rays are collectively referred to as optical sensors. An optical sensor having sensitivity to light in a visible light region with a wavelength of 400 nm to 700 nm is particularly referred to as a visible light sensor. A large number of visible light sensors are used for devices that require illuminance adjustment, on/off control, or the like depending on human living environment.

Known examples of visible light sensors are a photodiode that is a photoelectric conversion element utilizing photoelectric conversion properties of single crystal silicon or amorphous silicon, and a photo IC provided with a phototransistor or an amplifier circuit that amplifies an output of a photodiode.

For example, Patent Document 1 discloses an example of a photo IC in which a photodiode using amorphous silicon and an amplifier circuit using polycrystalline silicon are formed over one substrate.

REFERENCE

Patent Document 1: Japanese Published Patent Application No. 2005-136392

SUMMARY OF THE INVENTION

In the photo IC disclosed in Patent Document 1, a signal is read while a reverse bias is always applied as in a photodiode, which results in a problem of large power consumption.

In view of the above problem, an object of one embodiment of the present invention is to provide a photoelectric conversion device with low power consumption and a method for operating the photoelectric conversion device.

One embodiment of the present invention disclosed in this specification is a photoelectric conversion device including a charge storage capacitor portion, a photodiode, and a transistor, and has a feature in that the charge storage capacitor portion is discharged through the photodiode or a current mirror circuit connected to the photodiode after being charged.

One embodiment of the present invention disclosed in this specification is a photoelectric conversion device including a photodiode, a first transistor, a second transistor, a third transistor, a charge storage capacitor portion, and a first to sixth terminals. One of electrodes of the charge storage capacitor portion is electrically connected to a source electrode of the first transistor, a drain electrode of the second transistor, a drain electrode of the third transistor, and the sixth terminal. The other of the electrodes of the charge storage capacitor portion is electrically connected to an anode of the photodiode, a source electrode of the third transistor, and the second terminal. A source electrode of the second transistor is electrically connected to a cathode of the photodiode. A drain electrode of the first transistor is electrically connected to the first terminal. A gate electrode of the first transistor is electrically connected to the third terminal. A gate electrode of the second transistor is electrically connected to the fourth terminal A gate electrode of the third transistor is electrically connected to the fifth terminal.

In this specification and the like, ordinal numbers such as "first", "second", and "third" are used to avoid confusion among components, and the terms do not limit the order and number of the components.

Another embodiment of the present invention disclosed in this specification is a photoelectric conversion device including a photodiode, a first transistor, a second transistor, a third transistor, a current mirror circuit including a fourth transistor and a fifth transistor, a charge storage capacitor portion, and a first to sixth terminals. One of electrodes of the charge storage capacitor portion is electrically connected to a source electrode of the first transistor, a drain electrode of the second transistor, a drain electrode of the third transistor, and the sixth terminal. The other of the electrodes of the charge storage capacitor portion is electrically connected to a source electrode of the third transistor, a source electrode of the fourth transistor, a source electrode of the fifth transistor, and the second terminal. A source electrode of the second transistor is electrically connected to a drain electrode of the fifth transistor. A drain electrode of the first transistor is electrically connected to a cathode of the photodiode and the first terminal. A drain electrode of the fourth transistor is electrically connected to an anode of the photodiode, a gate electrode of the fourth transistor, and a gate electrode of the fifth transistor. A gate electrode of the first transistor is electrically connected to the third terminal. A gate electrode of the second transistor is electrically connected to the fourth terminal A gate electrode of the third transistor is electrically connected to the fifth terminal.

The first terminal is a high potential terminal. The second terminal is a low potential terminal. The third to fifth terminals are signal input terminals. The sixth terminal is a signal output terminal.

The above transistors preferably include an oxide semiconductor.

The above transistors can be n-channel transistors. Alternatively, the first transistor may be a p-channel transistor and the other transistors may be n-channel transistors.

Another embodiment of the present invention disclosed in this specification is a method for operating a photoelectric conversion device in the following order of steps. In the photoelectric conversion device, one of electrodes of a charge storage capacitor portion is electrically connected to a source electrode of a first transistor, a drain electrode of a second transistor, a drain electrode of a third transistor, and a sixth terminal; the other of the electrodes of the charge storage capacitor portion is electrically connected to an anode of a photodiode, a source electrode of the third transistor, and a second terminal; a source electrode of the second transistor is electrically connected to a cathode of the photodiode; a drain electrode of the first transistor is electrically connected to a first terminal; a gate electrode of the first transistor is electrically connected to a third terminal; a gate electrode of the second transistor is electrically connected to a fourth terminal; and a gate electrode of the third transistor is electrically connected to a fifth terminal. The first terminal is set at a high power supply potential and the second terminal is set at a low power supply potential. A potential for turning on the third transistor is supplied to the fifth terminal to discharge the charge storage capacitor portion. A potential for turning off the third transistor is supplied to the fifth terminal, and then a potential for turning on the first transistor is supplied to the third terminal to charge the charge storage capacitor portion. A potential for turning off the first transistor is supplied to the third terminal, and then a potential for turning on the second transistor is supplied to the fourth terminal to discharge the charge storage capacitor portion through the photodiode for a predetermined period of time. A potential for turning off the second transistor is supplied to the fourth terminal, and then a potential of the charge storage capacitor portion is read through the sixth terminal as a signal.

Another embodiment of the present invention disclosed in this specification is a method for operating a photoelectric conversion device in the following order of steps. In the photoelectric conversion device, one of electrodes of a charge storage capacitor portion is electrically connected to a source electrode of a first transistor, a drain electrode of a second transistor, a drain electrode of a third transistor, and a sixth terminal; the other of the electrodes of the charge storage capacitor portion is electrically connected to a source electrode of the third transistor, a source electrode of a fourth transistor, a source electrode of a fifth transistor, and a second terminal; a source electrode of the second transistor is electrically connected to a drain electrode of the fifth transistor; a drain electrode of the first transistor is electrically connected to a cathode of a photodiode and a first terminal; a drain electrode of the fourth transistor is electrically connected to an anode of the photodiode, a gate electrode of the fourth transistor, and a gate electrode of the fifth transistor; a gate electrode of the first transistor is electrically connected to a third terminal; a gate electrode of the second transistor is electrically connected to a fourth terminal; and a gate electrode of the third transistor is electrically connected to a fifth terminal. The first terminal is set at a high power supply potential and the second terminal is set at a low power supply potential. A potential for turning on the third transistor is supplied to the fifth terminal to discharge the charge storage capacitor portion. A potential for turning off the third transistor is supplied to the fifth terminal, and then a potential for turning on the first transistor is supplied to the third terminal to charge the charge storage capacitor portion. A potential for turning off the first transistor is supplied to the third terminal, and then a potential for turning on the second transistor is supplied to the fourth terminal to discharge the charge storage capacitor portion through the fifth transistor for a predetermined period of time. A potential for turning off the second transistor is supplied to the fourth terminal, and then a potential of the charge storage capacitor portion is read through the sixth terminal as a signal.

According to one embodiment of the present invention, a photoelectric conversion device with low power consumption and a method for operating the photoelectric conversion device can be provided.

BRIEF DESCRIPTION OF THE DRAWINGS

In the accompanying drawings:

FIGS. 2A and 2B are circuit diagrams each illustrating a photoelectric conversion device according to one embodiment of the present invention;

FIGS. 3A and 3B are circuit diagrams each illustrating a photoelectric conversion device according to one embodiment of the present invention;

DETAILED DESCRIPTION OF THE INVENTION

Figure 1A:
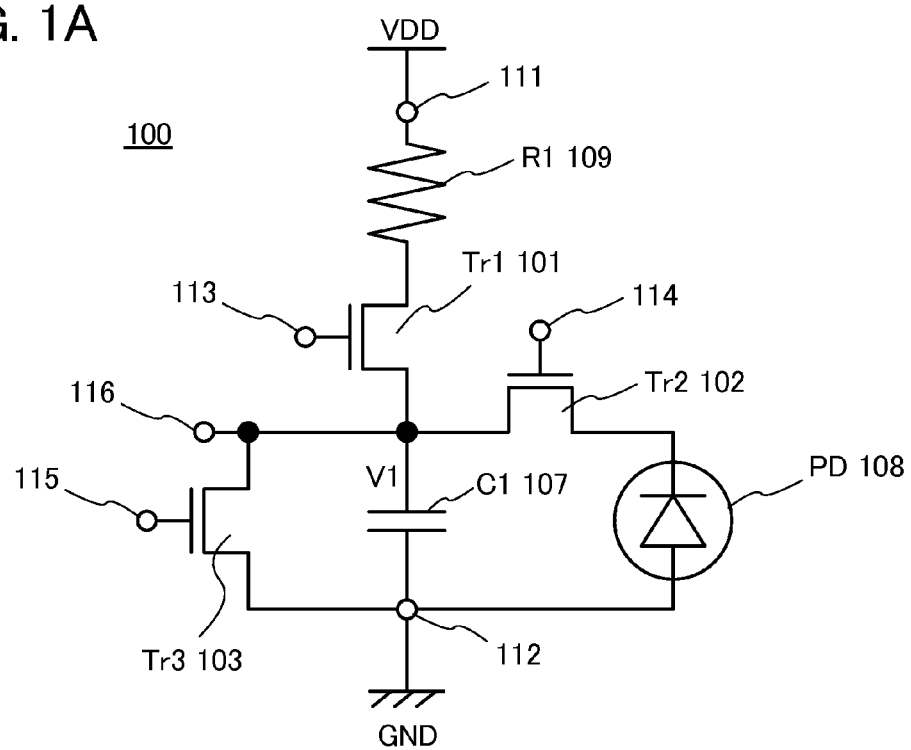
FIGS. 1A and 1B are circuit diagrams each illustrating a photoelectric conversion device according to one embodiment of the present invention.

Embodiments of the present invention will be described below with reference to the accompanying drawings. Note that the present invention can be carried out in many different modes, and it is easily understood by those skilled in the art that various changes and modifications can be made without departing from the spirit and scope of the present invention. Therefore, the present invention should not be limited to the descriptions of the embodiments. In the drawings for explaining the embodiments, the same portions or portions having similar functions are denoted by the same reference numerals, and description of such portions is not repeated in some cases.
(Embodiment 1)

In this embodiment, a structure and operation of a photoelectric conversion device according to one embodiment of the present invention will be described.

FIG. 1A is a circuit diagram of a photoelectric conversion device according to one embodiment of the present invention. A photoelectric conversion device 100 includes a first transistor 101, a second transistor 102, a third transistor 103, a charge storage capacitor portion 107, a photodiode 108, a protective resistor 109, a first terminal 111, a second terminal 112, a third terminal 113, a fourth terminal 114, a fifth terminal 115, and a sixth terminal 116. Note that all the transistors are n-channel transistors.

A drain electrode of the first transistor 101 is connected to the first terminal 111 through the protective resistor 109. A source electrode of the third transistor 103, one electrode of the charge storage capacitor portion 107, and an anode of the photodiode 108 are connected to the second terminal 112. A source electrode of the first transistor 101, a drain electrode of the second transistor 102, and a drain electrode of the third transistor 103 are connected to the other electrode of the charge storage capacitor portion 107. A cathode of the photodiode 108 is connected to a source electrode of the second transistor 102.

Here, the first terminal 111 is used as a high potential power supply terminal, and the second terminal 112 is used as a low potential power supply terminal. The third terminal 113 is connected to a gate electrode of the first transistor 101. The fourth terminal 114 is connected to a gate electrode of the second transistor 102. The fifth terminal 115 is connected to a gate electrode of the third transistor 103. The third to fifth terminals are used as signal input terminals.

The sixth terminal 116 is connected to the other electrode of the charge storage capacitor portion 107. The sixth terminal 116 is an output terminal for outputting a potential V1 of the charge storage capacitor portion 107. As has been described, the photoelectric conversion device according to one embodiment of the present invention has six terminals in total.

Note that the resistance of the protective resistor 109 and the capacitance of the charge storage capacitor portion 107 can be determined as appropriate by a practitioner, and one or both of the protective resistor 109 and the charge storage capacitor portion 107 can be omitted. For example, as the charge storage capacitor portion 107, the capacitor can be replaced with capacitance in source and drain regions of the first to third transistors or wiring capacitance.

As the photodiode 108, a PN photodiode formed using single crystal silicon, a PIN photodiode formed using polycrystalline silicon or amorphous silicon, or the like can be used. In order to use the photoelectric conversion device 100 in this embodiment as an optical sensor, a photodiode for an intended wavelength is selected. For example, a photodiode formed using amorphous silicon is preferably used to detect light in the visible wavelength range, and a photodiode formed using single crystal silicon or polycrystalline silicon is preferably used to detect light in a wavelength range including infrared rays.

The first to third transistors can be formed using a silicon semiconductor or an oxide semiconductor. Examples of a silicon semiconductor are single crystal silicon and polycrystalline silicon. An example of an oxide semiconductor is In—Ga—Zn—O-based metal oxide. For example, the transistor can be formed using a single crystal silicon wafer or polycrystalline silicon or an oxide semiconductor over a substrate having an insulating surface, such as a glass substrate.

An oxide semiconductor to be used preferably contains at least indium (In) or zinc (Zn). In particular, the oxide semiconductor preferably contains In and Zn. As a stabilizer for reducing variation in electric characteristics of a transistor including the oxide semiconductor, the oxide semiconductor preferably contains gallium (Ga) in addition to In and Zn. Moreover, the oxide semiconductor preferably contains tin (Sn), hafnium (Hf), and/or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

Examples of the oxide semiconductor to be used are an indium oxide; a tin oxide; a zinc oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; an oxide of three metal elements, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; and an oxide of four metal elements, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

An In—Ga—Zn-based oxide semiconductor material has sufficiently high resistance when there is no electric field and thus has a sufficiently low off-state current. In addition, the In—Ga—Zn-based oxide semiconductor material has a high field-effect mobility. Further, in a transistor including an In—Sn—Zn-based oxide semiconductor material, the field-effect mobility can be three times or more as high as that of a transistor including the In—Ga—Zn-based oxide semiconductor material, and the threshold voltage is likely to be positive. These semiconductor materials are one of the materials that can be favorably used for a transistor included in a semiconductor device according to one embodiment of the present invention.

Note that here, for example, an "In—Ga—Zn-based oxide" means an oxide containing In, Ga, and Zn as its main components and there is no particular limitation on the composition ratio of In, Ga, and Zn. Further, a metal element in addition to In, Ga, and Zn may be contained.

Further, a material represented by $InMO_3(ZnO)_m$ (m is larger than 0 and is not an integer) may be used as the oxide semiconductor. Note that M represents one or more metal elements selected from Ga, Fe, Mn, and Co. As the oxide semiconductor, a material represented by $In_3SnO_5(ZnO)_n$ (n is larger than 0 and is an integer) may be used. For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions.

Without limitation to the above, an oxide semiconductor with an appropriate composition ratio can be used in accordance with desired semiconductor characteristics (e.g., mobility, threshold voltage, and variation). In order to obtain needed semiconductor characteristics, an oxide semiconductor preferably has appropriate carrier density, impurity concentration, defect density, atomic ratio of a metal element to oxygen, bond distance, density, or the like.

For example, high mobility can be relatively easily obtained with an In—Sn—Zn-based oxide. Even when an In—Ga—Zn-based oxide is used, the mobility can be increased by a reduction in bulk defect density.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \leq r^2$, and r may be 0.05, for example. The same can be applied to other oxides.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained with relative ease. When a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by the following formula.

$$Ra = \frac{1}{S_0} \int_{y_1}^{y_2} \int_{x_1}^{x_2} |f(x, y) - Z_0| dx dy \quad \text{[Formula 1]}$$

Note that in Formula 1, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured with an atomic force microscope (AFM).

The target for forming the oxide semiconductor layer 144 by sputtering is, for example, an oxide target having a composition ratio of $In_2O_3:Ga_2O_3:ZnO=1:1:1$ [molar ratio]. Alternatively, an oxide target having a composition ratio of $In_2O_3:Ga_2O_3:ZnO=1:1:2$ [molar ratio] may be used.

In the case where an In—Zn—O-based material is used as the oxide semiconductor, a target used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), further preferably In:Zn=15:1 to 1.5:1 ($In_2O_3:ZnO=15:2$ to 3:4 in a molar ratio). For example, when a target used for forming an In—Zn-based oxide semiconductor has an atomic ratio of In:Zn:O=X:Y:Z, the relation of Z>1.5X+Y is satisfied.

An In—Sn—Zn-based oxide can be referred to as ITZO. For ITZO, an oxide target having a composition ratio of In:Sn:Zn=1:2:2, 2:1:3, 1:1:1, or 20:45:35 in an atomic ratio is used, for example.

Here, as the oxide semiconductor having crystallinity, an oxide including a crystal with c-axis alignment (also referred to as a c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 10A to 10E, FIGS. 11A to 11C, and FIGS. 12A to 12C. In FIGS. 10A to 10E, FIGS. 11A to 11C, and FIGS. 12A to 12C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 10A to 10E, O surrounded by a circle represents tetracoordinate O and O surrounded by a double circle represents tricoordinate O.

Figure 10A:
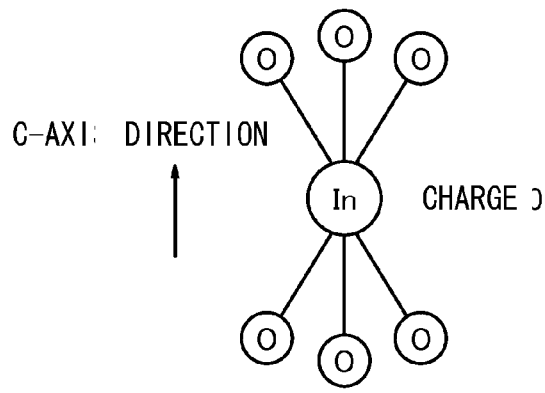
FIGS. 10A to 10E each illustrate a crystal structure of an oxide material.

FIG. 10A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 10A is actually an octahedral structure, but is illustrated as a planar structure for simplicity. Note that three tetracoordinate O atoms exist in each of an upper half and a lower half in FIG. 10A. In the small group illustrated in FIG. 10A, electric charge is 0.

Figure 10D:
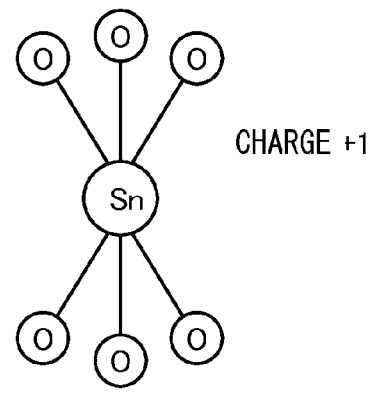
Figure 10B:
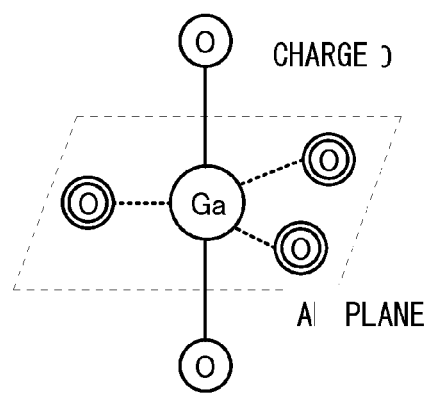

FIG. 10B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 10B. An In atom can also have the structure illustrated in FIG. 10B because an In atom can have five ligands. In the small group illustrated in FIG. 10B, electric charge is 0.

Figure 10E:
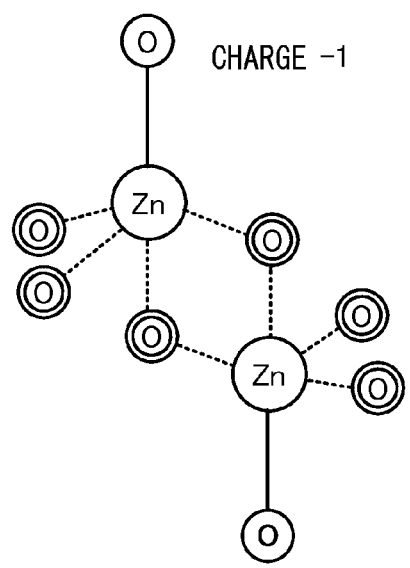
Figure 10C:
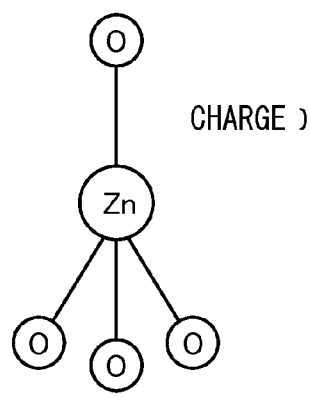

FIG. 10C illustrates a structure including one tetracoordinate Zn atom and four tetracoordinate O atoms proximate to the Zn atom. In FIG. 10C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 10C. In the small group illustrated in FIG. 10C, electric charge is 0.

FIG. 10D illustrates a structure including one hexacoordinate Sn atom and six tetracoordinate O atoms proximate to the Sn atom. In FIG. 10D, three tetracoordinate O atoms exist in each of an upper half and a lower half. In the small group illustrated in FIG. 10D, electric charge is +1.

FIG. 10E illustrates a small group including two Zn atoms. In FIG. 10E, one tetracoordinate O atom exists in each of an upper half and a lower half. In the small group illustrated in FIG. 10E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 10A each have three proximate In atoms in the downward direction, and the three O atoms in the lower half each have three proximate In atoms in the upward direction. The one O atom in the upper half with respect to the pentacoordinate Ga atom in FIG. 10B has one proximate Ga atom in the downward direction, and the one O atom in the lower half has one proximate Ga atom in the upward direction. The one O atom in the upper half with respect to the tetracoordinate Zn in FIG. 10C atom has one proximate Zn atom in the downward direction, and the three O atoms in the lower half each have three proximate Zn atoms in the upward direction. In this manner, the number of the tetracoordinate O atoms proximate to and above the metal atom is equal to the number of the metal atoms proximate to and below each of the tetracoordinate O atoms. Similarly, the number of the tetracoordinate O atoms proximate to and below the metal atom is equal to the number of the metal atoms proximate to and above each of the tetracoordinate O atoms. Since O atoms contributing the bonding between the small groups are the tetracoordinate O atoms, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

Figure 11A:
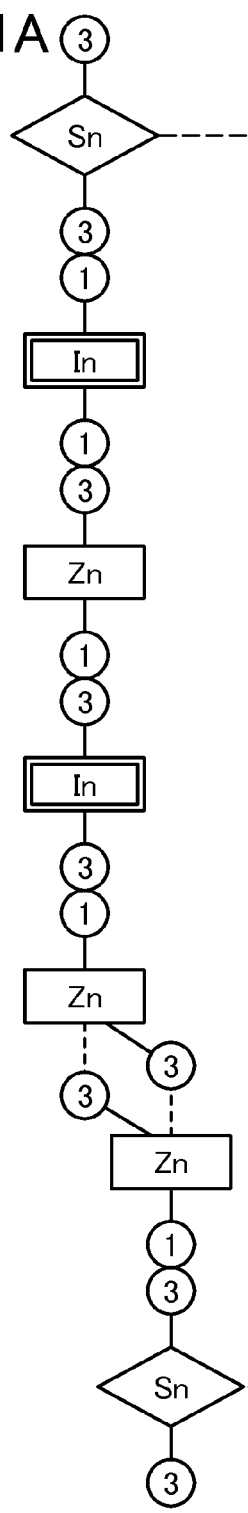
FIGS. 11A to 11C illustrate a crystal structure of an oxide material.
Figure 11B:
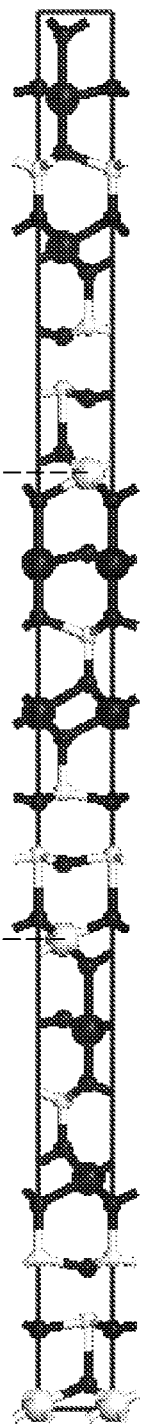
Figure 11C:

FIG. 11A illustrates a model of a medium group included in a layered structure of an In—Sn—Zn—O-based material. FIG. 11B illustrates a large group including three medium groups. FIG. 11C illustrates an atomic arrangement in the case where the layered structure in FIG. 11B is observed from the c-axis direction.

In FIG. 11A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 11A, one tetracoordinate O atom existing in each of an upper half and a lower half with respect to an In atom is denoted by circled 1. FIG. 11A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 11A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 10E can be given. For example, with one small group including two Zn atoms, electric charge of one small group including a Sn atom can be cancelled, so that the total electric charge of the layered structure can be 0.

When the large group illustrated in FIG. 11B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an oxide of four metal elements, such as an In—Sn—Ga—Zn-based oxide; an oxide of three metal elements, such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide.

Figure 12A:
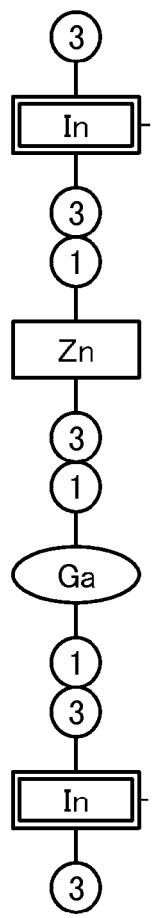
FIGS. 12A to 12C illustrate a crystal structure of an oxide material.

As an example, FIG. 12A illustrates a model of a medium group included in a layered structure of an In—Ga—Zn—O-based material.

In the medium group included in the layered structure of the In—Ga—Zn—O-based material in FIG. 12A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 12B:
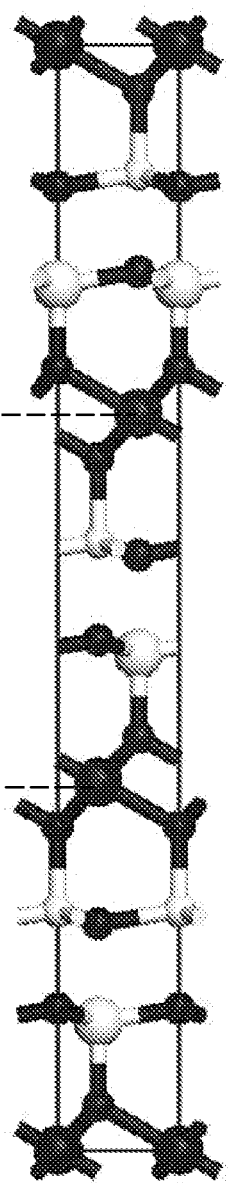
Figure 12C:
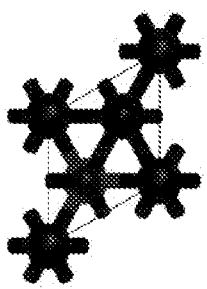

FIG. 12B illustrates a large group including three medium groups. FIG. 12C illustrates an atomic arrangement in the case where the layered structure in FIG. 12B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 12A but also a medium group in which the arrangement of the In atom, the Ga atom, and the Zn atom is different from that in FIG. 12A.

In the case of using an oxide semiconductor, the first to third transistors may be a combination of a transistor formed using the oxide semiconductor and a transistor formed using a silicon semiconductor.

The transistor formed using an oxide semiconductor has electric characteristics of extremely low off-state current. The oxide semiconductor is preferably purified by sufficient removal of impurities such as hydrogen and sufficient supply of oxygen. Specifically, the concentration of hydrogen in the oxide semiconductor is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower, for example. Note that the concentration of hydrogen in the oxide semiconductor is measured by secondary ion mass spectrometry (SIMS). The density of carriers generated due to a donor such as hydrogen in the oxide semiconductor, in which hydrogen is reduced to a sufficiently low concentration so that the oxide semiconductor is purified and in which defect states in an energy gap due to oxygen vacancy are reduced by sufficiently supplying oxygen as described above, is less than $1 \times 10^{12}$/cm$^3$, preferably less than $1 \times 10^{11}$/cm$^3$, further preferably less than $1.45 \times 10^{10}$/cm$^3$. In addition, for example, the off-state current (per unit channel width (1 μm), here) at room temperature (25° C.) is 100 zA (1 zA (zeptoampere) is $1 \times 10^{-21}$ A) or less, preferably 10 zA or less. In this manner, by using an i-type (intrinsic) or substantially i-type oxide semiconductor, the transistor having extremely favorable off-state current characteristics can be obtained.

In the case where a transistor that is formed using an oxide semiconductor and thus has an extremely low off-state current is used as the first to third transistors, the potential of the charge storage capacitor portion 107 can be retained for a long time.

A conventional photodiode and a photoelectric conversion device from which a signal is read with application of a reverse bias as in a photodiode always consume power when operating. In contrast, the photoelectric conversion device according to one embodiment of the present invention can operate without consuming power during standby or at the time of reading, except in charging operation of the charge storage capacitor portion 107.

Figure 9:
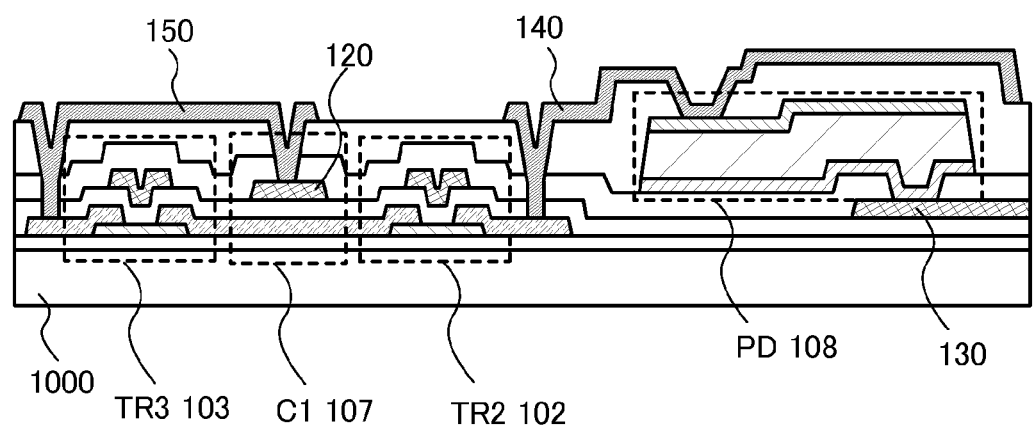
FIG. 9 is a cross-sectional view illustrating a photoelectric conversion device according to one embodiment of the present invention.

A cross-sectional view in FIG. 9 shows an example of connection between the photodiode 108, the second transistor 102, the third transistor 103, and the charge storage capacitor portion 107 in the circuit configuration illustrated in FIG. 1A. The photodiode 108 exemplified in FIG. 9 is a PIN photodiode in which a P layer, an I layer, and an N layer are sequentially stacked from a glass substrate 1000 side, and the P layer side serves as the anode and the N layer side serves as the cathode. Each of the transistors includes an oxide semiconductor layer, metal layers serving as a source electrode and a drain electrode, a gate insulating film, and a metal layer serving as a gate electrode. The charge storage capacitor portion 107 is formed using the same materials as the metal layer serving as the source electrode and the drain electrode, the gate insulating film, and the metal layer serving as the gate electrode of the transistors.

A connection electrode 130 is connected to the anode of the photodiode 108. A rear electrode 140 is connected to the cathode of the photodiode 108. The rear electrode 140 is also connected to the source electrode of the second transistor 102. Although not shown, the connection electrode 130 is connected to a wiring 150 that is connected to the source electrode of the third transistor 103 and an other electrode 120 of the charge storage capacitor portion 107. Using such connection relation, the photoelectric conversion device with the circuit configuration in FIG. 1A can be formed.

Note that FIG. 9 illustrates the top-gate transistor including an oxide semiconductor as an example; alternatively, the transistor may be a bottom-gate transistor. Moreover, the transistor may be formed using a silicon semiconductor material.

Next, the operation of the photoelectric conversion device 100 according to one embodiment of the present invention, illustrated in FIG. 1A, will be described.

Figure 5A:
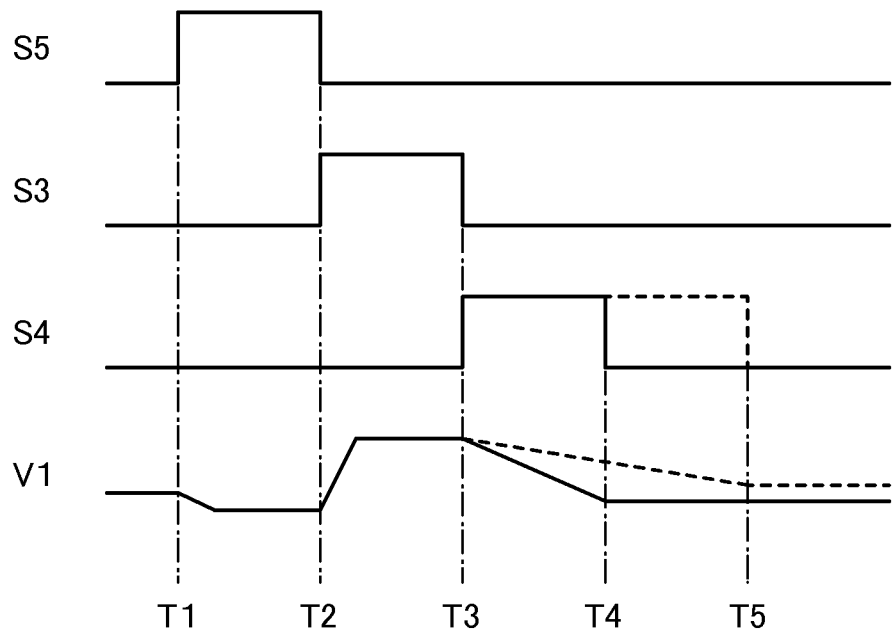
FIGS. 5A and 5B are timing charts each illustrating operation of a photoelectric conversion device according to one embodiment of the present invention.

FIG. 5A is a timing chart for explaining the operation of the photoelectric conversion device illustrated in FIG. 1A. S5 is the potential of a signal input to the fifth terminal 115. S3 is the potential of a signal input to the third terminal 113. S4 is the potential of a signal input to the fourth terminal 114. Moreover, V1 is the potential of the charge storage capacitor portion 107. Although not shown, the potential of the first terminal 111 is always a high potential (e.g., a power supply potential), and the potential of the second terminal 112 is always a low potential (e.g., a ground potential). Further, T1 to T5 represent time.

First, at the time T1, S5 is set high ("H"), and the third transistor 103 is turned on and V1 is reset.

At the time T2, when S5 is set low ("L") and S3 is set "H", the third transistor 103 is turned off and the first transistor 101 is turned on; thus, the charge storage capacitor portion 107 is charged and the V1 is set at a predetermined value.

At the time T3, when S3 is set "L" and S4 is set "H", the first transistor 101 is turned off and the second transistor 102 is turned on. At this time, a reverse bias is applied to the photodiode 108 and a discharge current based on the illuminance flows from the charge storage capacitor portion 107 through the photodiode 108 to the second terminal 112, so that V1 is changed.

At the time T4, when S4 is set "L", the second transistor 102 is turned off and V1 is kept at the value at that time. Here, the value of V1 can be adjusted by adjusting a discharge period from the time T3 to the time T4. For example, when the photoelectric conversion device is employed in a device used in low illuminance environment, setting a long discharge period from the time T3 to the time T5 shown by dotted lines can increase the dynamic range. On the other hand, when the photoelectric conversion device is employed in a device used in high illuminance environment, a reduction in the discharge period can prevent over-discharge of the charge storage capacitor portion 107 and increase the dynamic range.

Then, at a given time after the time T4 or the time T5, V1 is read from the sixth terminal 116 as a signal. Note that by using a transistor that is formed using an oxide semiconductor and thus has an extremely low off-state current as the transistor connected to the charge storage capacitor portion 107, V1 can be retained for a long time.

In the above-described operation, power from the power source is consumed only in a period for charging the charge storage capacitor portion 107 from the time T2 to the time T3. That is, the photoelectric conversion device can operate with extremely low power consumption.

Figure 1B:
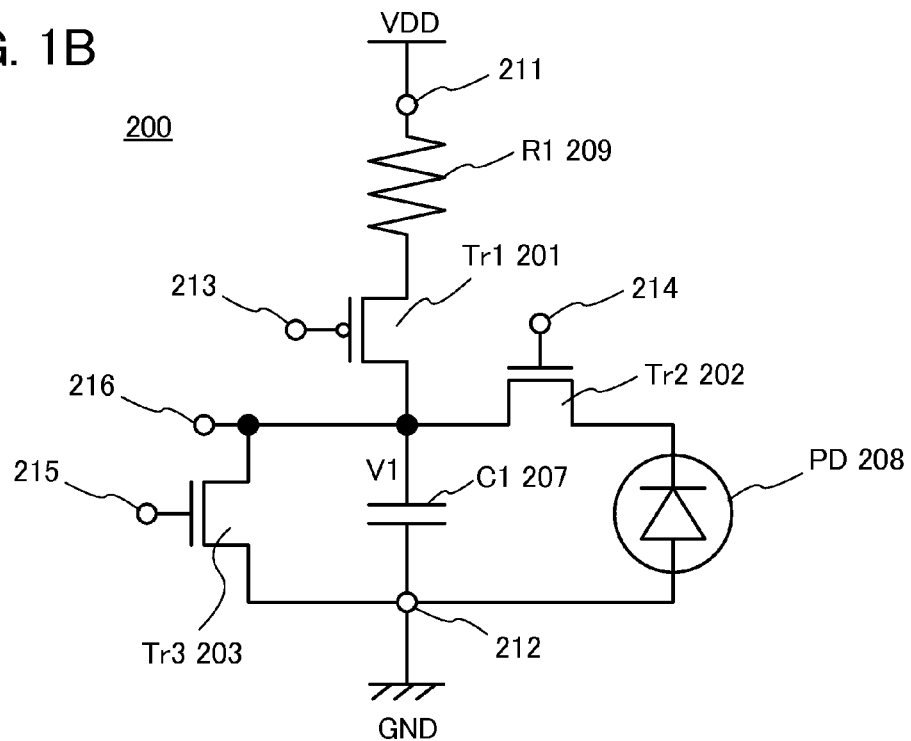

A photoelectric conversion device having a circuit configuration illustrated in FIG. 1B can be operated in a manner similar to one having the circuit configuration in FIG. 1A.

A photoelectric conversion device 200 in FIG. 1B includes a first transistor 201, a second transistor 202, a third transistor 203, a charge storage capacitor portion 207, a photodiode 208, a protective resistor 209, a first terminal 211, a second terminal 212, a third terminal 213, a fourth terminal 214, a fifth terminal 215, and a sixth terminal 216. Note that the first transistor 201 is a p-channel transistor, and the other transistors are n-channel transistors.

A source electrode of the first transistor 201 is connected to the first terminal 211 through the protective resistor 209. A source electrode of the third transistor 203, one electrode of the charge storage capacitor portion 207, and an anode of the photodiode 208 are connected to the second terminal 212. A drain electrode of the first transistor 201, a drain electrode of the second transistor 202, and a drain electrode of the third transistor 203 are connected to the other electrode of the charge storage capacitor portion 207. A cathode of the photodiode 208 is connected to a source electrode of the second transistor 202.

Here, the first terminal 211 is used as a high potential power supply terminal, and the second terminal 212 is used as a low potential power supply terminal. The third terminal 213 is connected to a gate electrode of the first transistor 201. The fourth terminal 214 is connected to a gate electrode of the second transistor 202. The fifth terminal 215 is connected to a gate electrode of the third transistor 203. The third to fifth terminals are used as signal input terminals.

The sixth terminal 216 is connected to the other electrode of the charge storage capacitor portion 207. The sixth terminal 216 is an output terminal for outputting a potential V1 of the charge storage capacitor portion 207.

The photoelectric conversion device 100 in FIG. 1A and the photoelectric conversion device 200 in FIG. 1B have the same configuration except the polarity of the first transistor. The first transistor 101 in the photoelectric conversion device 100 is an n-channel transistor, whereas the first transistor 201 in the photoelectric conversion device 200 is a p-channel transistor.

Figure 5B:
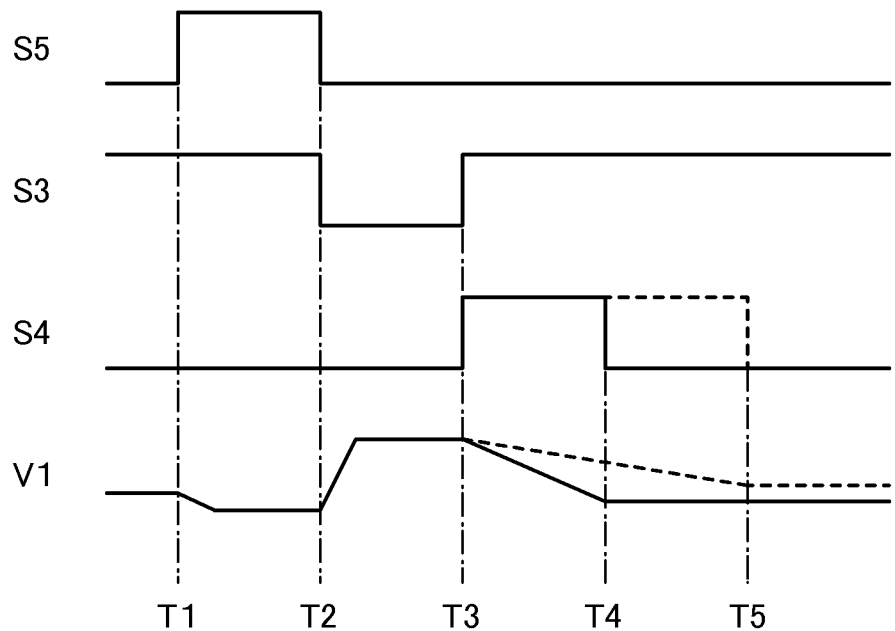

FIG. 5B is a timing chart for explaining the operation of the photoelectric conversion device 200. The operation of the photoelectric conversion device 200 is basically the same as the operation described using FIG. 5A, except the signal S3 for operating the first transistor 201, which is a p-channel transistor.

When the first transistor is an n-channel transistor, a power supply voltage higher than V1 is necessary for operating the first transistor. On the other hand, when the first transistor is a p-channel transistor, the first transistor can operate regardless of the value of V1. Therefore, in the case where a p-channel transistor is used as the first transistor, the power supply voltage can be lowered within the range where a voltage necessary for an output signal is obtained.

Figure 8A:
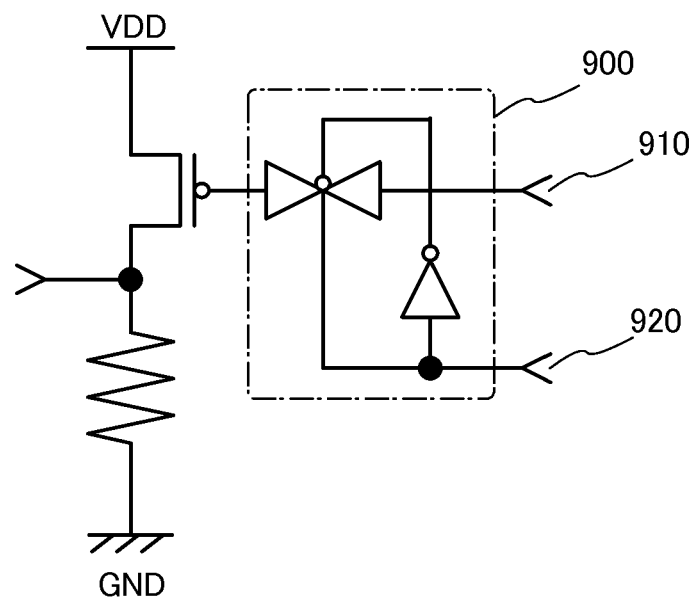
FIGS. 8A and 8B are circuit diagrams each illustrating a circuit connected to an output portion of a photoelectric conversion device.
Figure 8B:
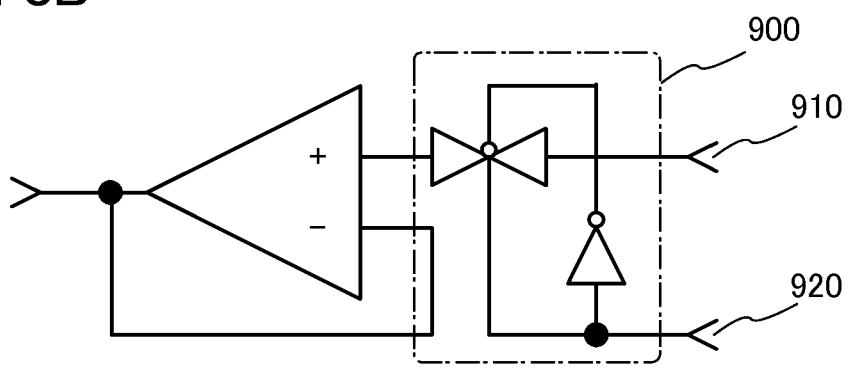

An output signal input portion 910 of an output signal control circuit 900 illustrated in FIGS. 8A and 8B is connected to the sixth terminals 116 and 216. The output signal control circuit 900 is constituted by an inverter and an analog switch, and includes the output signal input portion 910 and an output control signal input portion 920. A source follower circuit illustrated in FIG. 8A, an operational amplifier illustrated in FIG. 8B, or the like is connected to the analog switch.

As described above, according to one embodiment of the present invention, a photoelectric conversion device that can operate with extremely low power consumption can be provided.

This embodiment can be implemented in combination with any of the structures described in the other embodiments as appropriate.

(Embodiment 2)

In this embodiment, a structure and operation of a photoelectric conversion device which is different from that in Embodiment 1 will be described.

FIG. 2A is a circuit diagram of a photoelectric conversion device according to one embodiment of the present invention. A photoelectric conversion device 300 includes a first transistor 301, a second transistor 302, a third transistor 303, a fourth transistor 304, a fifth transistor 305, a charge storage capacitor portion 307, a photodiode 308, a protective resistor 309, a first terminal 311, a second terminal 312, a third terminal 313, a fourth terminal 314, a fifth terminal 315, and a sixth terminal 316. The fourth transistor 304 and the fifth transistor 305 form a current mirror circuit 320. Here, one output transistor (fifth transistor 305) is shown as an example; alternatively, a plurality of output transistors may be provided. Note that all the transistors are n-channel transistors.

To the first terminal 311, a cathode of the photodiode 308 is connected, and a drain electrode of the first transistor 301 is connected through the protective resistor 309. A source electrode of the third transistor 303, one electrode of the charge storage capacitor portion 307, a source electrode of the fourth transistor 304, and a source electrode of the fifth transistor 305 are connected to the second terminal 312. A source electrode of the first transistor 301, a drain electrode of the second transistor 302, and a drain electrode of the third transistor 303 are connected to the other electrode of the charge storage capacitor portion 307. A drain electrode of the fifth transistor 305 is connected to a source electrode of the second transistor 302. A drain electrode and a gate electrode of the fourth transistor 304 are connected to an anode of the photodiode 308.

Here, the first terminal 311 is used as a high potential power supply terminal, and the second terminal 312 is used as a low potential power supply terminal. The third terminal 313 is connected to a gate electrode of the first transistor 301. The fourth terminal 314 is connected to a gate electrode of the second transistor 302. The fifth terminal 315 is connected to a gate electrode of the third transistor 303. The third to fifth terminals are used as signal input terminals.

The sixth terminal 316 is connected to the other electrode of the charge storage capacitor portion 307. The sixth terminal 316 is an output terminal for outputting a potential V1 of the charge storage capacitor portion 307. As has been described, the photoelectric conversion device according to one embodiment of the present invention has six terminals in total.

The photodiode and the transistors can be similar to those in the photoelectric conversion devices 100 and 200 described in Embodiment 1. Particularly when a transistor that is formed using an oxide semiconductor and thus has an extremely low off-state current is used, the potential of the charge storage capacitor portion 307 can be retained for a long time.

Like the photoelectric conversion devices 100 and 200 described in Embodiment 1, the photoelectric conversion device according to one embodiment of the present invention can operate without consuming power during standby or at the time of reading, except in charging operation of the charge storage capacitor portion 307.

Next, the operation of the photoelectric conversion device 300 according to one embodiment of the present invention, illustrated in FIG. 2A, will be described.

The operation of the photoelectric conversion device 300 is similar to that of the photoelectric conversion device 100 described in Embodiment 1, and can be described using the timing chart in FIG. 5A. S5 is the potential of a signal input to the fifth terminal 315. S3 is the potential of a signal input to the third terminal 313. S4 is the potential of a signal input to the fourth terminal 314. V1 is the potential of the charge storage capacitor portion 307. Although not shown, the potential of the first terminal 311 is always a high potential (e.g., a power supply potential), and the potential of the second terminal 312 is always a low potential (e.g., a ground potential). Further, T1 to T5 represent time.

First, at the time T1, S5 is set high ("H"), and the third transistor 303 is turned on and V1 is reset.

At the time T2, when S5 is set low ("L") and S3 is set "H", the third transistor 303 is turned off and the first transistor 301 is turned on; thus, the charge storage capacitor portion 307 is charged and the V1 is set at a predetermined value.

At the time T3, when S3 is set "L" and S4 is set "H", the first transistor 301 is turned off and the second transistor 302 is turned on. At this time, in the current mirror circuit 320 to which the photodiode 308 is connected, a current corresponding to the illuminance flows to the fourth transistor 304 from the photodiode 308, and the gate voltage is generated at the gate electrode of the fifth transistor 305. Consequently, the fifth transistor 305 is also turned on.

Then, a current corresponding to the illuminance flows via the second transistor 302 and the fifth transistor 305, and V1 is changed.

At the time T4, when S4 is set "L", the second transistor 302 is turned off and V1 is kept at the value at that time. Here, the value of V1 can be adjusted by adjusting a discharge period from the time T3 to the time T4. For example, when the photoelectric conversion device is employed in a device used in low illuminance environment, setting a long discharge period from the time T3 to the time T5 shown by dotted lines can increase the dynamic range. On the other hand, when the photoelectric conversion device is employed in a device used in high illuminance environment, a reduction in the discharge period can prevent over-discharge of the charge storage capacitor portion 307 and increase the dynamic range.

Then, at a given time after the time T4 or the time T5, V1 is read from the sixth terminal 316 as a signal. By using a transistor that is formed using an oxide semiconductor and thus has an extremely low off-state current as the transistor connected to the charge storage capacitor portion 307, V1 can be retained for a long time.

In the above-described operation, power from the power source is consumed only in a period for charging the charge storage capacitor portion 307 from the time T2 to the time T3. That is, the photoelectric conversion device can operate with extremely low power consumption.

A photoelectric conversion device having a circuit configuration illustrated in FIG. 2B can be operated in a manner similar to one having the circuit configuration in FIG. 2A.

A photoelectric conversion device 400 in FIG. 2B includes a first transistor 401, a second transistor 402, a third transistor 403, a fourth transistor 404, a fifth transistor 405, a charge storage capacitor portion 407, a photodiode 408, a protective resistor 409, a first terminal 411, a second terminal 412, a third terminal 413, a fourth terminal 414, a fifth terminal 415, and a sixth terminal 416. The fourth transistor 404 and the fifth transistor 405 form a current mirror circuit 420. Here, one output transistor (fifth transistor 405) is shown as an example; alternatively, a plurality of output transistors may be provided. Note that the first transistor 401 is a p-channel transistor, and the other transistors are n-channel transistors.

To the first terminal 411, a cathode of the photodiode 408 is connected, and a source electrode of the first transistor 401 is connected through the protective resistor 409. A source electrode of the third transistor 403, one electrode of the charge storage capacitor portion 407, a source electrode of the fourth transistor 404, and a source electrode of the fifth transistor 405 are connected to the second terminal 412. A drain electrode of the first transistor 401, a drain electrode of the second transistor 402, and a drain electrode of the third transistor 403 are connected to the other electrode of the charge storage capacitor portion 407. A drain electrode of the fifth transistor 405 is connected to a source electrode of the second transistor 402. A drain electrode and a gate electrode of the fourth transistor 404 are connected to an anode of the photodiode 408.

Here, the first terminal 411 is used as a high potential power supply terminal, and the second terminal 412 is used as a low potential power supply terminal. The third terminal 413 is connected to a gate electrode of the first transistor 401. The fourth terminal 414 is connected to a gate electrode of the second transistor 402. The fifth terminal 415 is connected to a gate electrode of the third transistor 403. The third to fifth terminals are used as signal input terminals.

The sixth terminal 416 is connected to the other electrode of the charge storage capacitor portion 407. The sixth terminal 416 is an output terminal for outputting a potential V1 of the charge storage capacitor portion 407.

The photoelectric conversion device 300 in FIG. 2A and the photoelectric conversion device 400 in FIG. 2B have the same configuration except the polarity of the first transistor. The first transistor 301 in the photoelectric conversion device 300 is an n-channel transistor, whereas the first transistor 401 in the photoelectric conversion device 400 is a p-channel transistor.

The operation of the photoelectric conversion device 400 can be described using the timing chart in FIG. 5B. The operation of the photoelectric conversion device 400 is basically the same as the operation described using FIG. 5A, except the signal S3 for operating the first transistor 401, which is a p-channel transistor.

When the first transistor is an n-channel transistor, a power supply voltage higher than V1 is necessary for operating the first transistor. On the other hand, when the first transistor is a p-channel transistor, the first transistor can operate regardless of the value of V1. Therefore, in the case where a p-channel transistor is used as the first transistor, the power supply voltage can be lowered within the range where a voltage necessary for an output signal is obtained.

Note that in the current mirror circuit included in the photoelectric conversion devices 300 and 400, charge stored in a gate capacitance is discharged via a path through the fourth transistor 304 or the fourth transistor 404, so that it takes a long time to reset the gate potential generated at the gate capacitance of the photoelectric conversion device. If the photoelectric conversion device performs the next operation in this period, an abnormal value is sometimes output; therefore, it is preferable to reset the gate potential in a short time.

In view of the above, as illustrated in FIGS. 3A and 3B, n-channel transistors as sixth transistors 306 and 406 may be connected in parallel with the respective fourth transistors 304 and 404 to form a leakage path of the gate capacitance. In the case of providing the sixth transistors 306 and 406, seventh terminals 317 and 417 connected to a gate electrode of the sixth transistor are provided, which means that the photoelectric conversion devices 300 and 400 each have seven terminals in total.

Figure 6A:
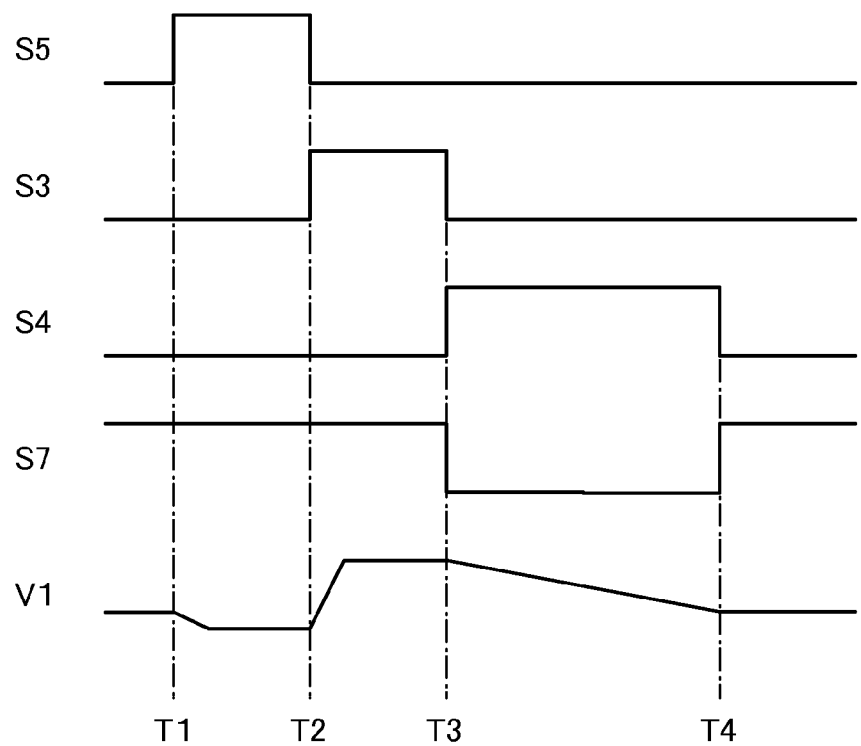
FIGS. 6A and 6B are timing charts each illustrating operation of a photoelectric conversion device according to one embodiment of the present invention.
Figure 6B:
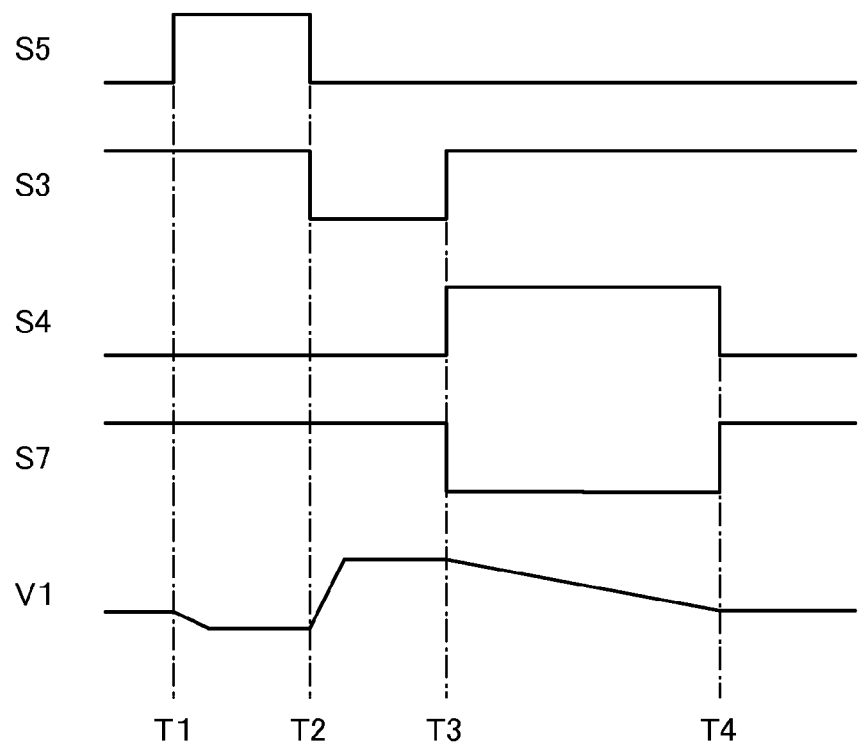

Next, the operations of the photoelectric conversion devices including the sixth transistors 306 and 406 will be described with reference to timing charts in FIGS. 6A and 6B.

The operations are basically the same as those in FIGS. 5A and 5B. A potential S7 of a signal input to the seventh terminals 317 and 417 each of which is connected to the gate electrode of the sixth transistor is at "L" level in a period from the time T3 to the time T4 during which the fifth transistor is on, and is at "H" level in other periods.

By employing such a circuit configuration and operation, charge stored in the gate capacitance of the current mirror circuit can be rapidly discharged, thereby preventing malfunction.

This embodiment can be implemented in combination with any of the structures described in the other embodiments as appropriate.

(Embodiment 3)

In this embodiment, a structure and operation of a photoelectric conversion device which is different from the photoelectric conversion devices in Embodiments 1 and 2 will be described.

Figure 4A:
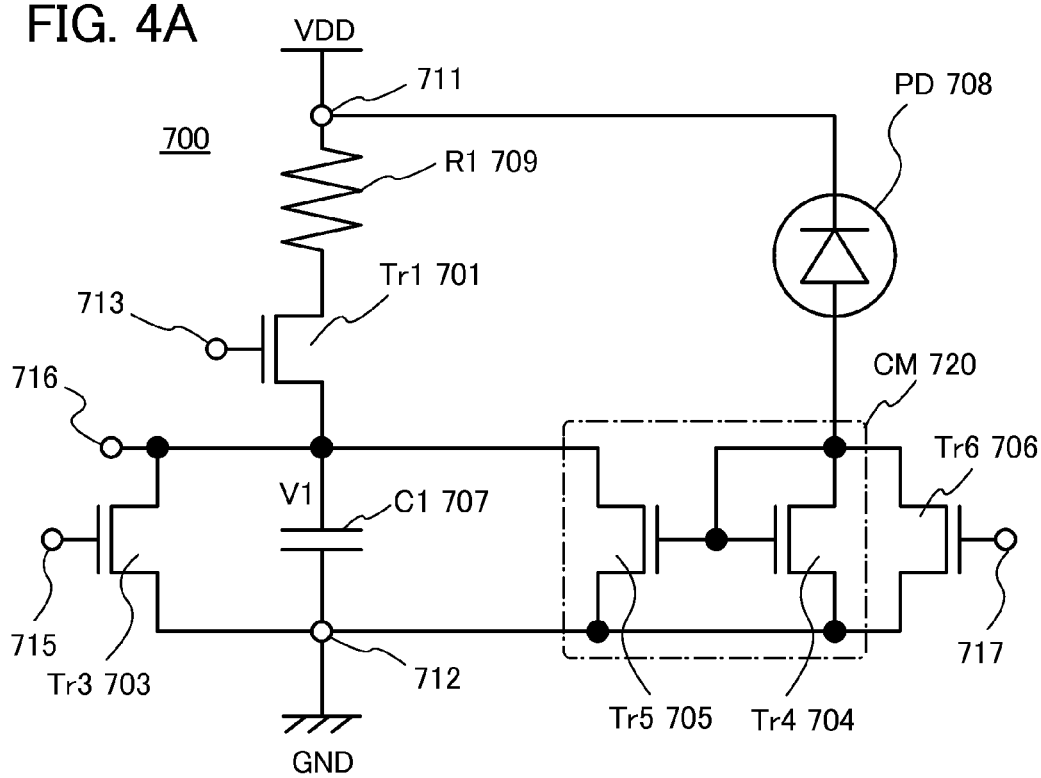
FIGS. 4A and 4B are circuit diagrams each illustrating a photoelectric conversion device according to one embodiment of the present invention.

FIG. 4A is a circuit diagram of a photoelectric conversion device according to one embodiment of the present invention. A photoelectric conversion device 700 includes a first transistor 701, a third transistor 703, a fourth transistor 704, a fifth transistor 705, a sixth transistor 706, a charge storage capacitor portion 707, a photodiode 708, a protective resistor 709, a first terminal 711, a second terminal 712, a third terminal 713, a fifth terminal 715, and a sixth terminal 716. The fourth transistor 704 and the fifth transistor 705 form a current mirror circuit 720. Here, one output transistor (fifth transistor 705) is shown as an example; alternatively, a plurality of output transistors may be provided. The sixth transistor 706 is provided to be used as a leakage path of charge stored in the gate capacitance of the current mirror circuit 720, and can be omitted. Note that all the transistors are n-channel transistors.

To the first terminal 711, a cathode of the photodiode 708 is connected, and a drain electrode of the first transistor 701 is connected through the protective resistor 709. A source electrode of the third transistor 703, one electrode of the charge storage capacitor portion 707, a source electrode of the fourth transistor 704, and a source electrode of the fifth transistor 705 are connected to the second terminal 712. A source electrode of the first transistor 701, a drain electrode of the third transistor 703, and a drain electrode of the fifth transistor 705 are connected to the other electrode of the charge storage capacitor portion 707. A drain electrode and a gate electrode of the fourth transistor 704 are connected to an anode of the photodiode 708.

Here, the first terminal 711 is used as a high potential power supply terminal, and the second terminal 712 is used as a low potential power supply terminal The third terminal 713 is connected to a gate electrode of the first transistor 701. The fifth terminal 715 is connected to a gate electrode of the third transistor 703. The seventh terminal 717 is connected to a gate electrode of the sixth transistor 706. The third, fifth, and seventh terminals are used as signal input terminals.

The sixth terminal 716 is connected to the other electrode of the charge storage capacitor portion 707. The sixth terminal 716 is an output terminal for outputting a potential V1 of the charge storage capacitor portion 707. As has been described, the photoelectric conversion device according to one embodiment of the present invention has a total of six terminals: the first terminal, the second terminal, the third terminal, the fifth terminal, the sixth terminal, and the seventh terminal Note that the photoelectric conversion device has five terminals in total in the case where the sixth transistor 706 is not provided.

The circuit configuration of the photoelectric conversion device 700 in this embodiment is similar to that of the photoelectric conversion device 300 in Embodiment 2; the photoelectric conversion device 700 has a configuration in which the second transistor 302 included in the photoelectric conversion device 300 is omitted. Embodiment 2 can be therefore referred to for the description of the photodiode and the transistors that can be used in the photoelectric conversion device 700 in this embodiment and for the description of the effect of using such photodiode and transistors.

Next, the operation of the photoelectric conversion device 700 according to one embodiment of the present invention, illustrated in FIG. 4A, will be described.

Figure 7A:
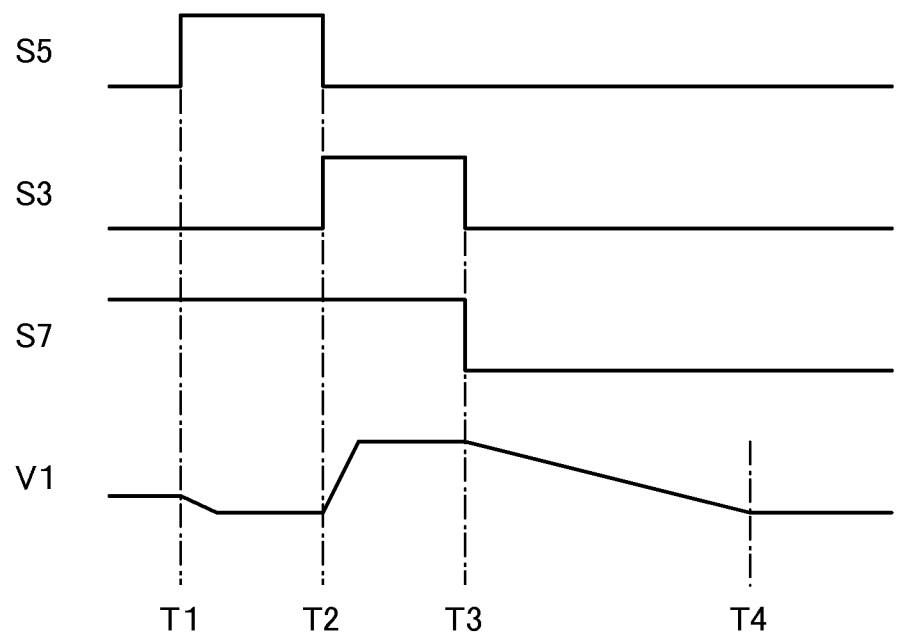
FIGS. 7A and 7B are timing charts each illustrating operation of a photoelectric conversion device according to one embodiment of the present invention.

FIG. 7A is a timing chart for explaining the operation of the photoelectric conversion device 700. S5 is the potential of a signal input to the fifth terminal 715. S3 is the potential of a signal input to the third terminal 713. S7 is the potential of a signal input to the seventh terminal 717. V1 is the potential of the charge storage capacitor portion 707. Although not shown, the potential of the first terminal 711 is always a high potential (e.g., a power supply potential), and the potential of the second terminal 712 is always a low potential (e.g., a ground potential). Further, T1 to T4 represent time.

First, at the time T1, S5 is set high ("H"), and the third transistor 703 is turned on and V1 is reset. Moreover, by setting S7 at "H" level, the sixth transistor 706 is turned on, and charge stored in the gate capacitance of the current mirror circuit is discharged. Since a photocurrent of the photodiode flows to the sixth transistor 706 at this time, a voltage is not generated at the gate electrode in the current mirror circuit, and the fifth transistor 705 is not turned on.

At the time T2, when S5 is set low ("L") and S3 is set "H", the third transistor 703 is turned off and the first transistor 701 is turned on; thus, the charge storage capacitor portion 707 is charged and the V1 is set at a predetermined value.

At the time T3, when S3 and S7 are set "L", the first transistor 701 and the sixth transistor 706 are turned off. At this time, in the current mirror circuit 720 to which the photodiode 708 is connected, a current corresponding to the illuminance flows to the fourth transistor 704 from the photodiode 708, and the gate voltage is generated at the gate electrode of the fifth transistor 705. Consequently, the fifth transistor 705 is also turned on.

Then, a discharge current based on the illuminance flows via the fifth transistor 305, and V1 is changed.

Since V1 continues to be changed toward a reset potential at that time, V1 is read from the sixth terminal 716 as a signal at a given time from the time T3 to the time T4 at which the V1 returns to the reset potential. Here, when a transistor that is formed using an oxide semiconductor and thus has an extremely low off-state current is used as the transistor connected to the charge storage capacitor portion 707, an accidental reduction in V1 can be suppressed, and an accurate signal can be output.

In the above operation, power from the power source is consumed only in a period for charging the charge storage capacitor portion 707 from the time T2 to the time T3. That is, the photoelectric conversion device can operate with extremely low power consumption.

Figure 4B:
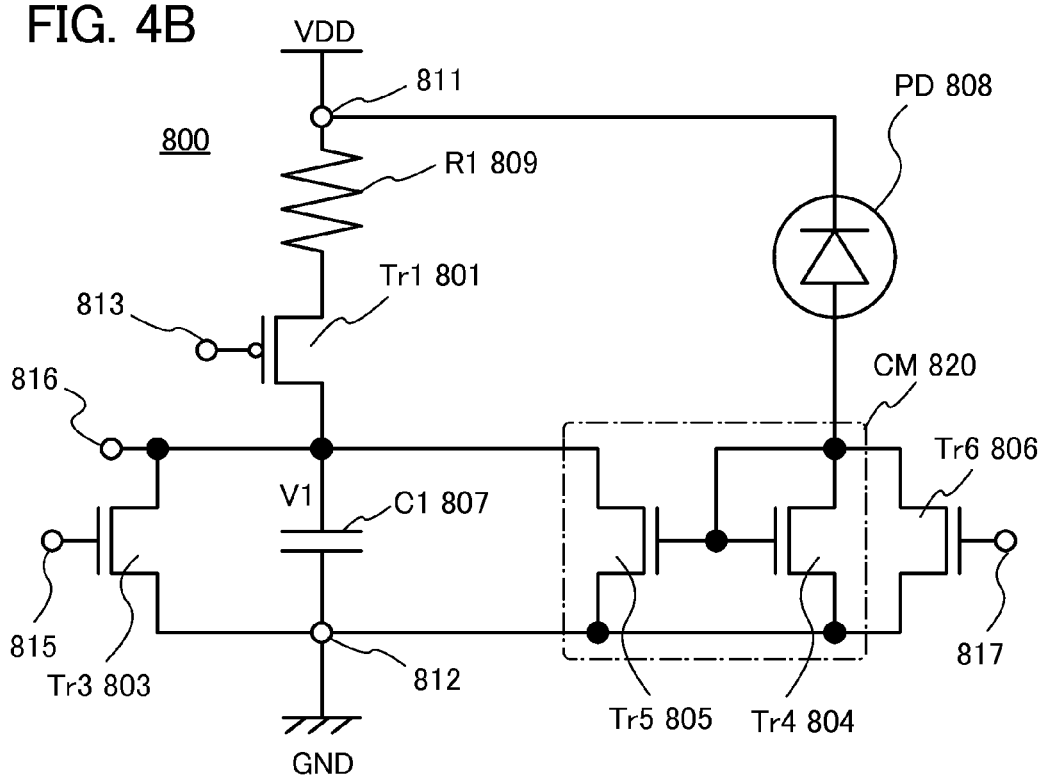

A photoelectric conversion device having a circuit configuration illustrated in FIG. 4B can be operated in a manner similar to one having the circuit configuration in FIG. 4A.

A photoelectric conversion device 800 in FIG. 4B includes a first transistor 801, a third transistor 803, a fourth transistor 804, a fifth transistor 805, a sixth transistor 806, a charge storage capacitor portion 807, a photodiode 808, a protective resistor 809, a first terminal 811, a second terminal 812, a third terminal 813, a fifth terminal 815, and a sixth terminal 816. The fourth transistor 804 and the fifth transistor 805 form a current mirror circuit 820. Here, one output transistor (fifth transistor 805) is shown as an example; alternatively, a plurality of output transistors may be provided. Note that the first transistor 801 is a p-channel transistor, and the other transistors are n-channel transistors.

To the first terminal 811, a cathode of the photodiode 808 is connected, and a source electrode of the first transistor 801 is connected through the protective resistor 809. A source electrode of the third transistor 803, one electrode of the charge storage capacitor portion 807, a source electrode of the fourth transistor 804, and a source electrode of the fifth transistor 805 are connected to the second terminal 812. A drain electrode of the first transistor 801, a drain electrode of the third transistor 803, and a drain electrode of the fifth transistor 805 are connected to the other electrode of the charge storage capacitor portion 807. A drain electrode and a gate electrode of the fourth transistor 804 are connected to an anode of the photodiode 808.

Here, the first terminal 811 is used as a high potential power supply terminal, and the second terminal 812 is used as a low potential power supply terminal. The third terminal 813 is connected to a gate electrode of the first transistor 801. The fifth terminal 815 is connected to a gate electrode of the third transistor 803. The seventh terminal 817 is connected to a gate electrode of the sixth transistor 806. The third, fifth, and seventh terminals are used as signal input terminals.

The sixth terminal 816 is connected to the other electrode of the charge storage capacitor portion 807. The sixth terminal 816 is an output terminal for outputting a potential V1 of the charge storage capacitor portion 807.

The photoelectric conversion device 700 in FIG. 4A and the photoelectric conversion device 800 in FIG. 4B have the same configuration except the polarity of the first transistor. The first transistor 701 in the photoelectric conversion device 700 is an n-channel transistor, whereas the first transistor 801 in the photoelectric conversion device 800 is a p-channel transistor.

Figure 7B:
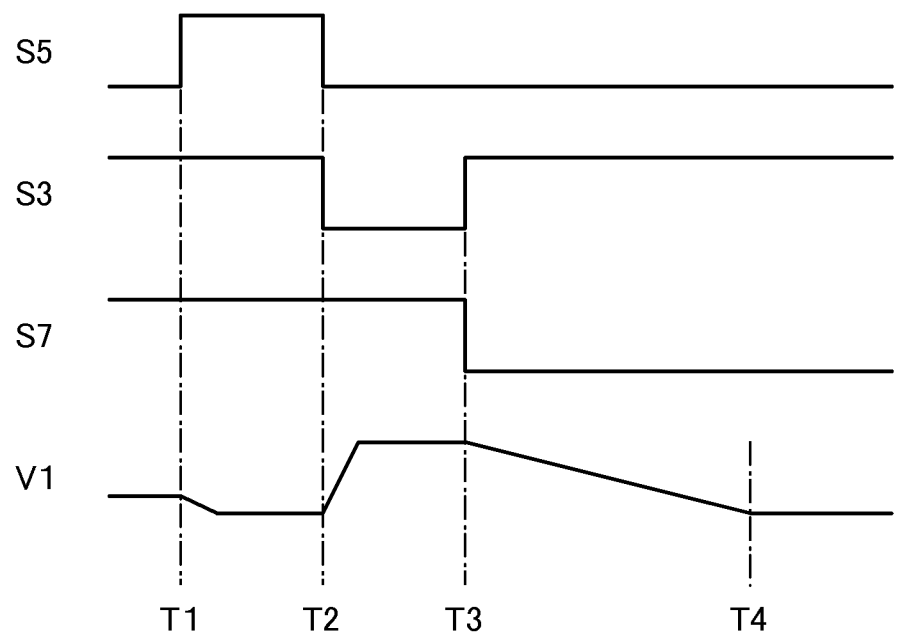

The operation of the photoelectric conversion device 800 can be described using a timing chart in FIG. 7B. The operation of the photoelectric conversion device 800 is basically the same as the operation described using FIG. 7A, except the signal S3 for operating the first transistor 801, which is a p-channel transistor.

When the first transistor is an n-channel transistor, a power supply voltage higher than V1 is necessary for operating the first transistor; whereas when the first transistor is a p-channel transistor, the first transistor can operate regardless of the value of V1. Therefore, in the case where a p-channel transistor is used as the first transistor, the power supply voltage can be lowered within the range where a voltage necessary for an output signal is obtained.

This embodiment can be implemented in combination with any of the structures described in the other embodiments as appropriate.

This application is based on Japanese Patent Application serial No. 2010-242912 filed with Japan Patent Office on Oct. 29, 2010, the entire contents of which are hereby incorporated by reference.

What is claimed is:

1. A method for operating a photoelectric conversion device,
wherein one of electrodes of a charge storage capacitor portion is electrically connected to a source electrode of a first transistor, a drain electrode of a second transistor, a drain electrode of a third transistor, and a sixth terminal,
wherein the other of the electrodes of the charge storage capacitor portion is electrically connected to an anode of a photodiode, a source electrode of the third transistor, and a second terminal,
wherein a source electrode of the second transistor is electrically connected to a cathode of the photodiode,
wherein a drain electrode of the first transistor is electrically connected to a first terminal;
wherein a gate electrode of the first transistor is electrically connected to a third terminal,
wherein a gate electrode of the second transistor is electrically connected to a fourth terminal; and
wherein a gate electrode of the third transistor is electrically connected to a fifth terminal,
the method comprising the steps of:
setting the first terminal at a high power supply potential and the second terminal at a low power supply potential,
supplying a first potential for turning on the third transistor to the fifth terminal to discharge the charge storage capacitor portion,
supplying a second potential for turning off the third transistor to the fifth terminal after supplying the first potential,
supplying a third potential for turning on the first transistor to the third terminal to charge the charge storage capacitor portion,
supplying a fourth potential for turning off the first transistor to the third terminal after supplying the third potential,
supplying a fifth potential for turning on the second transistor to the fourth terminal to discharge the charge storage capacitor portion through the photodiode, supplying a sixth potential for turning off the second transistor to the fourth terminal after supplying the fifth potential, and
reading a seventh potential of the charge storage capacitor portion through the sixth terminal as a signal.

2. The photoelectric conversion device according to claim 1,
wherein the first to third transistors comprise an oxide semiconductor.

3. The photoelectric conversion device according to claim 1,
wherein the first terminal is electrically connected to a high potential power supply,
wherein the second terminal is electrically connected to a low potential power supply,
wherein the third to fifth terminals are signal input terminals, and
wherein the sixth terminal is a signal output terminal.

4. The photoelectric conversion device according to claim 1,
wherein the first to third transistors are n-channel transistors.

5. The photoelectric conversion device according to claim 1,
wherein the first transistor is a p-channel transistor, and
wherein the second transistor and the third transistor are n-channel transistors.

6. A method for operating a photoelectric conversion device,
wherein one of electrodes of a charge storage capacitor portion is electrically connected to a source electrode of a first transistor, a drain electrode of a second transistor, a drain electrode of a third transistor, and a sixth terminal,
wherein the other of the electrodes of the charge storage capacitor portion is electrically connected to a source electrode of the third transistor, a source electrode of a fourth transistor, a source electrode of a fifth transistor, and a second terminal,
wherein a source electrode of the second transistor is electrically connected to a drain electrode of the fifth transistor; a drain electrode of the first transistor is electrically connected to a cathode of a photodiode and a first terminal,
wherein a drain electrode of the fourth transistor is electrically connected to an anode of the photodiode, a gate electrode of the fourth transistor, and a gate electrode of the fifth transistor; a gate electrode of the first transistor is electrically connected to a third terminal, and
wherein a gate electrode of the second transistor is electrically connected to a fourth terminal; and a gate electrode of the third transistor is electrically connected to a fifth terminal,
the method comprising the steps of:
setting the first terminal at a high power supply potential and the second terminal at a low power supply potential;
supplying a first potential for turning on the third transistor to the fifth terminal to discharge the charge storage capacitor portion;
supplying a second potential for turning off the third transistor to the fifth terminal after supplying the first potential;
supplying a third potential for turning on the first transistor to the third terminal to charge the charge storage capacitor portion;
supplying a fourth potential for turning off the first transistor to the third terminal after supplying the third potential;
supplying a fifth potential for turning on the second transistor to the fourth terminal to discharge the charge storage capacitor portion through the fifth transistor;
supplying a sixth potential for turning off the second transistor to the fourth terminal; and
reading a seventh potential of the charge storage capacitor portion through the sixth terminal as a signal.

7. The photoelectric conversion device according to claim 6,
wherein the first to fifth transistors comprise an oxide semiconductor.

8. The photoelectric conversion device according to claim 6,
wherein the first terminal is electrically connected to a high potential power supply,
wherein the second terminal is electrically connected to a low potential power supply,
wherein the third to fifth terminals are signal input terminals, and
wherein the sixth terminal is a signal output terminal.

9. The photoelectric conversion device according to claim 6,
wherein the first to third transistors are n-channel transistors.

10. The photoelectric conversion device according to claim 6,
wherein the first transistor is a p-channel transistor, and
wherein the second transistor and the third transistor are n-channel transistors.

11. The photoelectric conversion device according to claim 6, further comprising a sixth transistor connected in parallel with the fourth transistor.

12. The photoelectric conversion device according to claim 11,
wherein the source electrode and the drain electrode of the fourth transistor are electrically connected to a source electrode and a drain electrode of the sixth transistor, respectively.

* * * * *